United States Patent
Lee

(10) Patent No.: US 7,432,203 B2
(45) Date of Patent: Oct. 7, 2008

(54) METHODS FOR FABRICATING A METAL LAYER PATTERN

(75) Inventor: Jae Suk Lee, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 298 days.

(21) Appl. No.: 11/147,675

(22) Filed: Jun. 8, 2005

(65) Prior Publication Data

US 2006/0060978 A1   Mar. 23, 2006

(30) Foreign Application Priority Data

Jun. 9, 2004   (KR) .............. 10-2004-0042174

(51) Int. Cl.
*H01L 21/44* (2006.01)

(52) U.S. Cl. .................. 438/688; 438/608

(58) Field of Classification Search ........... 438/622, 438/688, 608
See application file for complete search history.

(56) References Cited

U.S. PATENT DOCUMENTS

| | | | | |
|---|---|---|---|---|
| 5,798,301 A | * | 8/1998 | Lee et al. | ............ 438/653 |
| 5,990,007 A | * | 11/1999 | Kajita et al. | ............ 438/680 |
| 6,036,876 A | * | 3/2000 | Chen et al. | ............ 216/67 |
| 6,451,691 B2 | * | 9/2002 | Song et al. | ............ 438/653 |
| 6,589,657 B2 | * | 7/2003 | Dannenberg | ............ 428/432 |
| 2003/0035906 A1 | * | 2/2003 | Memarian et al. | ............ 428/1.3 |

* cited by examiner

*Primary Examiner*—Thanh Nguyen

(74) *Attorney, Agent, or Firm*—Andrew D. Fortney

(57) ABSTRACT

Semiconductor devices and methods of fabricating the same are disclosed. An illustrated semiconductor device fabricating method includes forming a titanium and titanium-nitride (Ti/TiN) metal layer on a lower oxide layer; forming an aluminum metal layer on the Ti/TiN metal layer; forming an indium tin oxide (ITO) layer on the aluminum metal layer; and patterning the ITO layer, the aluminum metal layer, and the Ti/TiN metal layer by photolithography to form a metal layer pattern and to expose a surface of the lower oxide layer, thereby facilitating a process of filling inter-wiring spaces occurring between adjacent lines of a metal layer pattern by producing a metal layer pattern having a reduced aspect ratio.

13 Claims, 2 Drawing Sheets

METHODS FOR FABRICATING A METAL LAYER PATTERN

FIELD OF THE DISCLOSURE

The present disclosure relates generally to semiconductor fabrication, and, more specifically, to semiconductor devices and methods of fabricating the same.

BACKGROUND

Along with the ever increasing integration of semiconductor devices comes a corresponding decrease in the pitch of the metal wiring used in such devices. Decreased pitch is inherent to increases in device integration. Pitch is a measured quality for describing a tightness or line-to-line proximity present in the arrangement of an array of patterned conductive lines in a semiconductor device. In semiconductor fabrication technology, pitch can be expressed in terms of aspect ratio, (i.e., the ratio of the height of a patterned structure to the width between adjacent patterned structures, which include a metal wiring layer in addition to other layers). Thus, increases in device integration naturally result in an increased aspect ratio since the minimum conductivity requirements necessitate an increase in the height of a line of metal wiring to compensate for any decrease in the line's width resulting from a reduced inter-line (inter-wire) spacing.

Meanwhile, to insulate the narrowly spaced metal lines from each other, an inter metal dielectric (IMD) material is disposed between the metal lines by forming an IMD layer on the patterned structure. However, the proper formation of such a layer becomes increasingly difficult as the aspect ratio is increased. Namely, after formation, the IMD layer often fails to completely fill the spaces existing between adjacent metal lines, thereby resulting in minute gaps (i.e., voids) occurring in corners and other recesses of at least some of the spaces. These voids can cause a variety of negative effects, including degraded device performance, reduced operational reliability, and increased defect rates.

BRIEF DESCRIPTION OF THE DRAWINGS

Reference will now be made in detail to the accompanying drawings. Wherever possible, like reference numbers will be used throughout the drawings to refer to the same or similar parts.

Figure 1:
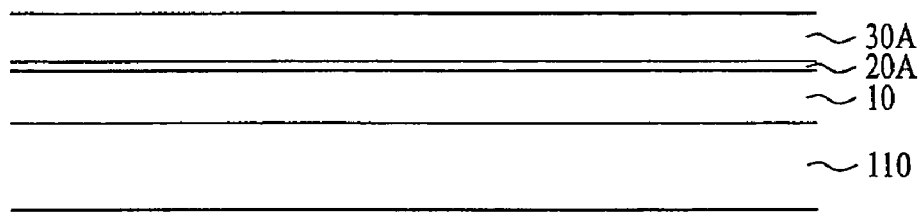
FIGS. 1-4 are cross-sectional diagrams illustrating an example semiconductor device fabricating method performed in accordance with the teachings of the present invention.

Layer thickness, relative proportions, and other dimensions may be exaggerated in the drawings to more clearly depict semiconductor components and materials, including layers, films, plates, and other areas. Also, throughout this specification, a description of a component or material that is, for example, "formed on" an underlying component or material permits the inclusion of an interceding component or material such that the described component or material may merely be disposed at some level higher than (e.g., "above") the underlying component or material, unless otherwise specified that there is no interceding component or material (i.e., unless specified that the described component or material is formed directly onto (e.g., "abutting") the underlying component or material).

DETAILED DESCRIPTION

Figure 4:
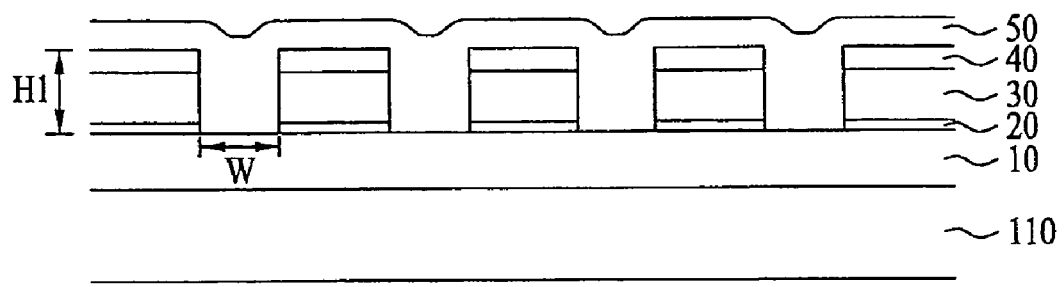
Figure 5:
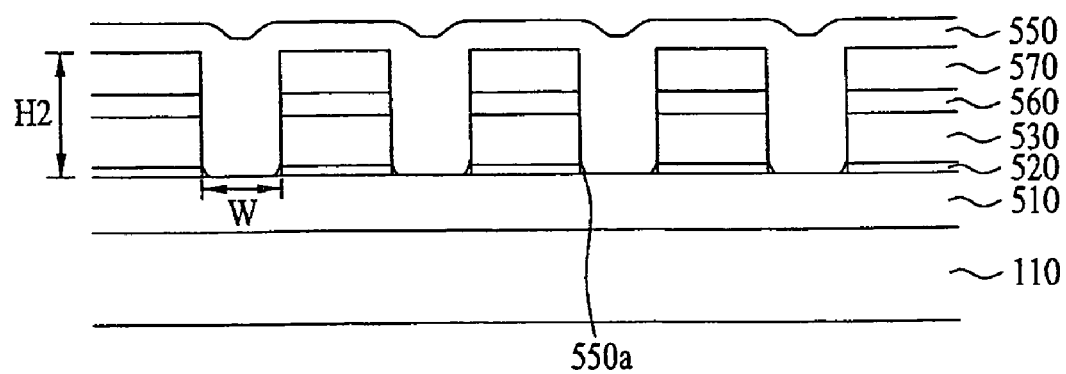
FIG. 5 is a cross-sectional diagram of an example semiconductor device fabricated by a prior art method.

An example semiconductor device constructed in accordance with the teachings of the invention is shown in FIG. 4. The example semiconductor device of FIG. 4 includes a titanium and titanium-nitride (Ti/TiN) metal layer pattern 20 disposed on a semiconductor substrate 110 including a lower oxide layer 10. An aluminum metal layer pattern 30 is disposed on the Ti/TiN metal layer pattern 20. An indium tin oxide (ITO) layer pattern 40 is disposed on the aluminum metal layer pattern 30. Each pattern forms a plurality of metal wiring lines as a common pattern. An inter-metal dielectric (IMD) layer 50 is formed on the resulting structure. The Ti/TiN metal layer pattern 20, the aluminum metal layer pattern 30, and the ITO layer pattern 40 have coinciding patterns which leave an inter-wiring space between adjacent pairs of lines of the metal wiring pattern so that a surface of the lower oxide layer 10 is exposed. Thus, the IMD layer 50 is formed on the ITO layer pattern 40, and is also disposed between the lines of the metal wiring in the spaces above the exposed surfaces of the lower oxide layer 10. Preferably, the IMD layer 50 completely fills the spaces to leave no voids. While the IMD layer 50 is disposed particularly on the ITO layer pattern 40, the inter-metal dielectric material covers the resulting structure of the metal layer pattern, which includes the patterns 20, 30, and 40. (Patterns 20, 30, and 40 are sometimes collectively referenced herein as the metal layer pattern 20/30/40.) Notably, the aspect ratio (H1/W) of the metal layer pattern 20/30/40 is lower than the aspect ratio (H2/W) of a prior art metal layer pattern formed by a prior art method as shown in FIG. 5. This lower aspect ratio of the semiconductor device of FIG. 4 facilitates the process of filling inter-wiring spaces, (i.e., the spaces occurring between adjacent lines of the metal layer patterns), and preferably enables the spaces to be completely filled with the deposited material of the IMD layer 50.

An example method of fabricating an example semiconductor device performed in accordance with the teachings of the present invention will now be described with reference to FIGS. 1-4. A Ti/TiN layer 20A is formed on a lower oxide layer 10, which, in turn, is located on a semiconductor substrate 110. An aluminum metal layer 30A is then formed on the Ti/TiN metal layer 20A. Each of the Ti/TiN metal layer 20A and the aluminum metal layer 30A is preferably formed by sputtering. Each layer preferably has a thickness of about 1,000~20,000 Å.

Figure 2:
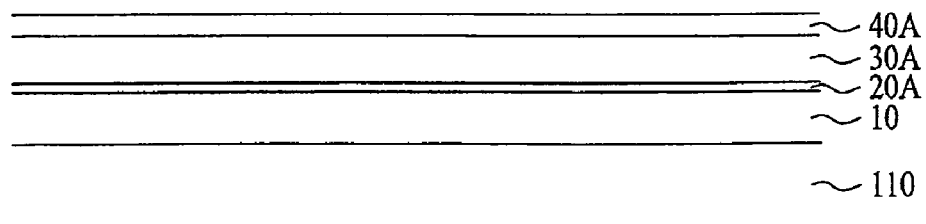

As shown in FIG. 2, after removing an oxidant layer (if present) from the aluminum metal layer 30A, an ITO layer 40A is formed as a conductive oxide layer on the aluminum metal layer 30A. The ITO layer 40A may be formed by metal-organic chemical vapor deposition, RF sputtering, reactive sputtering, or the like. The material of the ITO layer 40A preferably has a composition of $In_xSn_yO_z$, where x=0.2~0.3, y=0.2~0.3, and z=0.4~0.6. According to photolithography requirements, the ITO layer 40A preferably exhibits a refractive index (n) of about 1.0~2.0 and an absorption coefficient (k) of about 0.1~0.9.

Preferably, to prevent oxidation of the aluminum metal layer 30A, the Ti/TiN metal layer 20A, the aluminum metal layer 30A, and the ITO layer 40A are sequentially formed in the same deposition chamber or instrument. That is, the Ti/TiN metal layer 20A, the aluminum metal layer 30A, and the ITO layer 40A are preferably sequentially formed while the substrate remains under substantially constant atmospheric conditions. Otherwise, an oxidation layer naturally forms on the surface of the aluminum metal layer 30A between the fabrication stages of FIGS. 1 and 2, and this oxidation layer must then be removed. Such oxidation layer removal is preferably performed by a blanket etch technique, (e.g., a sputtering etch employing no etch mask pattern), which is performed in an ambient atmosphere of inert gas to etch the entire layer evenly. The inert gas is preferably one of helium, neon, argon, xenon, krypton, and radon.

Figure 3:
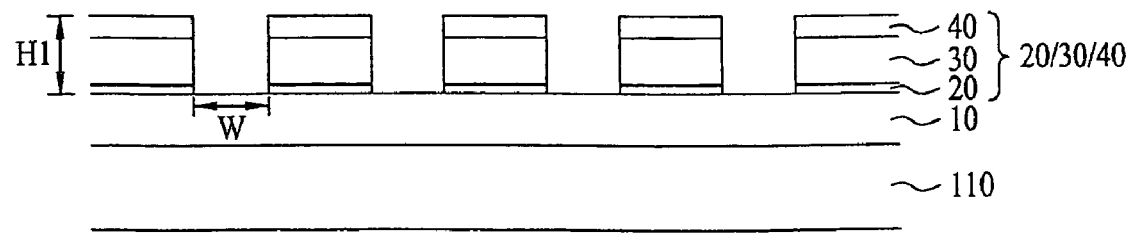

In FIG. 3, the metal layer pattern 20/30/40 is formed by carrying out photolithography on the ITO layer 40A, the aluminum metal layer 30A, and the Ti/TiN layer 20A, to expose a plurality of inter-wiring spaces occurring on the lower oxide layer 10 between adjacent lines of the metal layer pattern 20/30/40. Assuming an inter-wiring space width W and an inter-wiring space height H1, an aspect ratio of the metal layer pattern 20/30/40 can be expressed as "H1/W."

In FIG. 4, an IMD layer 50 is formed on the metal layer pattern 20/30/40. In doing so, the IMD layer 50 is disposed on the lower oxide layer 10 in places where the lower oxide layer is exposed between adjacent lines of the metal layer pattern.

In the prior art method of FIG. 5, instead of the ITO layer 40A of the above example, a Ti/TiN metal layer pattern 560 and a silicon oxynitride layer (SiON) 570 are sequentially disposed on an aluminum metal layer pattern 530, which results in a aspect ratio (H2/W) which is greater than the aspect ratio (H1/W) of FIG. 1 due to the increased height of the resulting metal layer pattern. That is, H2/W is greater than H1/W. The greater height of the prior art metal layer pattern leads to a failure in completely filling the inter-wiring spaces with the material of an IMD layer 550, thereby resulting in the formation of voids 550a.

To prevent incomplete filling, in the illustrated example, the metal layer pattern 20/30/40 is formed so that a lower aspect ratio is achieved. With this lower aspect ratio, the inter-wiring spaces between lines of the metal layer patterns can be completely filled with the IMD layer 50 thereby facilitating the process of filling the inter-wiring spaces while leaving no voids. That is, instead of forming the Ti/TiN metal layer pattern 560 and the silicon oxynitride layer 570 used in the prior art device of FIG. 5, the ITO layer pattern 40 is formed. Accordingly, the semiconductor device and fabricating method of FIGS. 1-4 also reduces the number of steps in the fabricating process in addition to lowering the aspect ratio of the metal layer pattern.

In view of the foregoing, persons of ordinary skill in the art will readily appreciate that semiconductor devices and methods of fabricating the same have been disclosed which substantially obviate one or more problems due to limitations and disadvantages of the prior art.

An illustrated example semiconductor device and an illustrated fabricating method facilitate the process of filling inter-wiring spaces occurring between the lines of a metal layer pattern. Further, the illustrated semiconductor device fabricating method optimizes device performance, operational reliability, and defect rates. In addition, the illustrated semiconductor device fabricating method produces a metal layer pattern having a reduced aspect ratio. Moreover, the illustrated semiconductor device fabricating method requires fewer steps than the prior art fabricating process described above.

A disclosed method of fabricating a semiconductor device comprises forming a titanium and titanium-nitride (Ti/TiN) metal layer on a lower oxide layer which is located on a semiconductor substrate; forming an aluminum metal layer on the Ti/TiN metal layer; forming an indium tin oxide (ITO) layer on the aluminum metal layer; and patterning the ITO layer, the aluminum metal layer, and the Ti/TiN metal layer by photolithography to form a metal layer pattern and to expose a surface of the lower oxide layer.

A disclosed semiconductor device comprises a semiconductor substrate including a lower oxide layer; a titanium and titanium-nitride (Ti/TiN) metal layer pattern above the lower oxide layer; an aluminum metal layer pattern above the Ti/TiN metal layer pattern; an indium tin oxide layer pattern above the aluminum metal layer pattern; and an inter metal dielectric layer covering the Ti/TiN metal layer pattern, the aluminum metal layer pattern, and the indium tin oxide layer pattern, wherein the Ti/TiN metal layer pattern, the aluminum metal layer pattern, and the indium tin oxide layer pattern coincide to leave an inter-wiring space between at least two adjacent lines of the metal layer pattern, so that a surface of the lower oxide layer located between adjacent lines of the metal layer pattern is exposed, and wherein the inter metal dielectric layer covers the exposed surface of the lower oxide layer.

This application claims the benefit of Korean Patent Application No., filed on Jun. 9, 2004, which is hereby incorporated by reference as if fully set forth herein.

It is noted that this patent claims priority from Korean Patent Application Serial Number 10-2004-0042174, which was filed on Jun. 9, 2004, and which is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of fabricating a semiconductor device comprising:
    forming a titanium and titanium-nitride (Ti/TiN) metal layer above a lower oxide layer located above a semiconductor substrate;
    forming an aluminum metal layer above the Ti/TiN metal layer;
    forming an indium tin oxide (ITO) layer above the aluminum metal layer; and
    patterning the ITO layer, the aluminum metal layer, and the Ti/TiN metal layer to form a metal layer pattern and to expose a surface of the lower oxide layer,
    wherein the Ti/TiN metal layer, aluminum metal layer, and ITO layer are sequentially formed in a same deposition chamber.

2. A method as defined in claim 1, further comprising forming an inter-metal dielectric layer on the metal layer pattern.

3. A method as defined in claim 2, wherein the inter-metal dielectric layer is disposed between at least two adjacent lines of the metal layer pattern in a space above the exposed surface of the lower oxide layer.

4. A method as defined in claim 3, wherein the inter-metal dielectric layer disposed between the at least two adjacent lines of metal layer pattern completely fills the space and leaves no void.

5. A method as defined in claim 3, wherein the metal layer pattern has an aspect ratio determined by a height of the metal layer pattern divided by a width of the space.

6. A method as defined in claim 1, wherein the Ti/TiN metal layer, the aluminum metal layer and the ITO layer are formed while the semiconductor substrate remains under constant atmospheric conditions.

7. A method as defined in claim 1, wherein the Ti/TiN metal layer has a thickness of about 1,000~20,000 Å.

8. A method as defined in claim 1, wherein the Ti/TiN metal layer is formed by sputtering.

9. A method as defined in claim 1, wherein the aluminum metal layer has a thickness of about 1,000~20,000 Å.

10. A method as defined in claim 1, wherein the aluminum metal layer is formed by sputtering.

11. A method as defined in claim 1, wherein the ITO layer is formed by at least one of metal-organic chemical vapor deposition, RF sputtering, and reactive sputtering.

12. A method as defined in claim 1, wherein the ITO layer has a composition of $In_xSn_yO_z$, where x=0.2~0.3, y=0.2~0.3, and z=0.4~0.6.

13. A method as defined in claim 1, wherein the ITO layer exhibits a refractive index (n) of about 1.0~2.0 and an absorption coefficient (k) of about 0.1~0.

* * * * *